United States Patent [19]

Young

[11] Patent Number: 5,264,383

[45] Date of Patent: Nov. 23, 1993

[54] METHOD OF MANUFACTURING A THIN FILM TRANSISTOR

[75] Inventor: Nigel D. Young, Redhill, England

[73] Assignee: U.S. Philips Corp., New York, N.Y.

[21] Appl. No.: 902,642

[22] Filed: Jun. 23, 1992

[30] Foreign Application Priority Data

Jun. 28, 1991 [GB] United Kingdom ............... 9114018

[51] Int. Cl.[5] ......................................... H01L 21/265
[52] U.S. Cl. ....................................... 437/40; 437/50; 437/229; 437/913; 148/DIG. 150
[58] Field of Search ................. 437/40, 41, 913, 84, 437/229, 101, 50, 181; 148/DIG. 150, DIG. 1

[56] References Cited

U.S. PATENT DOCUMENTS

| | | | |
|---|---|---|---|
| 4,174,219 | 11/1979 | Andres et al. | 156/659.1 |
| 4,393,572 | 7/1983 | Policastro et al. | 156/659.1 |
| 4,678,542 | 7/1987 | Boer et al. | 156/659.1 |
| 4,715,930 | 12/1987 | Diem | 437/229 |
| 4,727,044 | 2/1988 | Yamazaki | 437/101 |
| 4,788,157 | 11/1988 | Nakamura | 437/84 |
| 5,045,487 | 9/1991 | Kodama et al. | 437/229 |
| 5,053,353 | 10/1991 | Black | 148/DIG. 150 |
| 5,102,813 | 4/1992 | Kobayashi et al. | 437/40 |
| 5,114,871 | 5/1992 | Jones | 437/229 |

FOREIGN PATENT DOCUMENTS

| | | | |
|---|---|---|---|
| 62-119974 | 6/1987 | Japan | 437/40 |
| 62-152174 | 7/1987 | Japan | 437/40 |
| 63-79379 | 4/1988 | Japan | 437/41 |

Primary Examiner—Brian E. Hearn
Assistant Examiner—Michael Trinh
Attorney, Agent, or Firm—Steven R. Biren

[57] ABSTRACT

Source (51) and drain (52) of a thin-film transistor (TFT) are formed from a conductive layer (5) using a photolithographic step (FIG. 3) in which the gate (4) serves as a photomask. In accordance with the invention the insulated gate structure (3,4) is formed at the upper face of the channel-forming semiconductor film (2), i.e. remote from the transparent substrate (1). The semiconductor film (2) may be annealed to high-mobility polycrystalline material before depositing the gate structure (3,4) and the overlying conductive layer (5). In this way, high speed TFTs can be formed due to a combination of low gate-to-drain and gate-to-source capacitances and the provision of the transistor channel in the high quality semiconductor material adjacent to the upper face of the film (2). Preferably ultra-violet radiation (20: FIG. 1) is used for the annealing with an absorption depth less than the thickness of the film (2) so that the film-substrate interface is not heated which otherwise may weaken the adhesion of the film (2) to the substrate (1). By using an angled exposure in a photolithographic and etching step with the gate (4) as a shadow photomask, a low-doped drain part can be defined from a conductive layer (5) comprising highly-doped material on low-doped material. This low-doped drain part reduces the effect of high drain bias in operation of the TFT.

10 Claims, 3 Drawing Sheets

METHOD OF MANUFACTURING A THIN FILM TRANSISTOR

This invention relates to methods of manufacturing an insulated-gate thin-film transistor (TFT) using a photolithographic step in which the gate serves as a photomask, and further relates to TFTs manufactured by such a method. Such a method is particularly but not exclusively applicable for the manufacture of high speed TFTs comprising, for example, a polycrystalline silicon film which provides the transistor channel. Such transistors are of interest at present for large-area electronic circuitry on glass, for example in the driving circuitry of a large-area liquid-crystal display (LCD) or a sensor array or a memory array or a printer.

BACKGROUND OF THE INVENTION

Published Japanese patent application Kokai JP-A-62-152174 discloses a method of manufacturing an insulated-gate thin-film transistor comprising a semiconductor film which provides a transistor channel adjacent to an insulated gate between source and drain of the transistor. In this known method the semiconductor film is of amorphous silicon. The source and drain are formed from a conductive layer (of ITO, i.e. indium-tin-oxide, in this known method) which is removed from over the gate using a photolithographic step in which the gate serves as a photomask. This step involves exposing a negative photoresist on the conductive layer by illumination through a transparent substrate which is of glass in the known method.

In this known method of JP-A-62-152174, the insulated gate is formed on the substrate, after which the following sequence of layers are deposited: the semiconductor film, the conductive layer and the negative photoresist. The combination of the substrate, semiconductor film and conductive layer together is transparent to the illumination used to expose the photoresist, while the gate which serves as the photomask is opaque. The photomasked part of the ITO layer is etched away from the semiconductor film over the gate, after developing the photoresist.

By using this photolithographic and etching process as compared with a photolithographic lift-off process, the occurrence of short-circuits between the source and drain can be reduced. This improves the yield of the manufacturing process and enhances the reliability of the product. Furthermore, because the edges of the source and drain are defined using the gate as the photomask, an overlap between the gate and the source and drain is small or even avoided so reducing gate-to-drain and gate-to-source capacitance and hence increasing the speed of the TFT.

Published European patent application EP-A-0 071 244 discloses a variant of such a method in which, after the insulated gate is provided on the substrate, the conductive layer and photoresist are deposited before the semiconductor film. The photolithographic step and the definition of the source and drain are then carried out before depositing the semiconductor film. Subsequently this film is deposited either as polycrystalline or amorphous semiconductor material and provides the TFT channel adjacent to its bottom face. An advantage of polycrystalline material is that it has a higher mobility than amorphous material so increasing the speed of the TFTs, but this fact is not commented on in EP-A-0 071 244.

The present invention is based on a recognition that by adopting a different sequence of processing steps still using the gate as a photomask, even better device characteristics can be obtained in a manufacturing process with good yield and reliability. Thus, the applicants have found that it is advantageous to provide the semiconductor film on the substrate and to form the insulated gate (which is to serve as the photomask) at the upper face of the semiconductor film remote from the substrate. The source and drain conductive layer is removed from over the gate, but in this case the transistor channel is adjacent to the upper face of the semiconductor film. This configuration is beneficial especially (but not solely) when providing polycrystalline semiconductor material for high-speed transistors, for example by a crystallizing anneal of the deposited film.

In accordance with the present invention, there is provided a method of manufacturing an insulated-gate thin-film transistor comprising a semiconductor film which provides a transistor channel adjacent to an insulated gate between source and drain of the transistor. The source and drain are formed from a conductive layer which is removed from over the gate using a photolithographic step, in which step the gate serves as a photomask while exposing a negative photoresist on the conductive layer by illumination through a transparent substrate. According to the present invention, such a method is characterised by the steps of:

(a) depositing material for the semiconductor film, on the substrate, (b) forming the insulated gate at the upper face of the semiconductor film, which face is remote from the substrate, (c) depositing the conductive layer on the insulated gate and on the semiconductor film beside the insulated gate, (d) coating the conductive layer with the negative photoresist, and effecting the photolithographic step by exposing the photoresist through the combination of the substrate, semiconductor film and conductive layer which together are transparent to the illumination, and (e) removing the conductive layer from over the gate so as to leave separate parts of the conductive layer on the semiconductor film at opposite sides of the insulated gate, for forming the source and drain of the transistor.

Thus, by providing the gate as a photomask at the upper face of the semiconductor film, the present invention permits the achievement of low gate-to-drain and gate-to-source capacitances while also obtaining benefits of providing the transistor channel in the semiconductor material remote from the substrate. The applicants find that a better quality channel can be formed adjacent to the upper face of the semiconductor film, as compared with a transistor channel formed at the lower face of a semiconductor film deposited on an insulated gate on the substrate. The properties of the semiconductor material at the upper face are less affected by the substrate. The transistor may comprise an amorphous semiconductor film, but the invention is particularly advantageous for transistors with crystalline film material at least in the region of the transistor channel. Thus, the invention permits the manufacture of high-speed TFTs due both to the low gate-to-drain and gate-to-source capacitances and to the high mobility of the crystalline semiconductor material adjacent to the insulated gate at the upper face of the film.

There is at present considerable interest in developing high-speed polycrystalline TFTs for large-area flatpanel LCDs. These displays are addressed by a matrix of active devices (TFTs or diodes) with at least one device per pixel. The dominant and most widely used technology at present is based on amorphous silicon TFTs. However amorphous silicon TFTs are too slow to provide the driving circuitry so that at present the display is normally connected externally to peripherally-mounted integrated-circuits formed in monocrystalline silicon. The present invention permits the manufacture of sufficiently fast TFTs to implement the scanning and addressing circuitry functions for such large-area displays, and the display can be fabricated on the same substrate as these TFTs. For this purpose, the TFTs should have a sufficiently high mobility and low parasitic capacitance as to allow the construction of row and column shift registers operating at, for example, about 30 kHz and 11 MHz respectively, and for output driver TFTs to be able to charge the appropriate row or column capacitances. Such TFTs can be manufactured in accordance with the invention.

The semiconductor film may be deposited as crystalline material on the substrate in step (a). Thus, for example, by chemical vapour deposition at substrate temperatures of 600° to 620° C., columnar polycrystalline silicon can be deposited in a fine grain form with grain widths of up to about 0.1 μm. TFTs made from this material with the insulated gate at the upper face remote from the substrate may have mobilities in the range of, for example, 5 to 10 $cm^2.V^{-1}.s^{-1}$. It is found that the crystalline grain structure of the upper deposited material is usually better than that deposited immediately adjacent to the substrate.

However, the material for the semiconductor film may be deposited in a fine-grain or even amorphous form in step (a), and this deposited material may then be annealed on the substrate before step (b) so as to crystallize the film at least adjacent to its upper face which is remote from the substrate. Thus, for example, substantially amorphous silicon can be deposited with a substrate temperature of about 540° C. and using low-pressure chemical vapour deposition. Alternatively using plasma-enhanced chemical vapour deposition, amorphous silicon material may be deposited at a temperature as low as about 250° C. to 300° C. The film may be annealed by heating in a furnace. Thus, for example, with a furnace temperature of about 600° C., such amorphous silicon material can be converted into large-grain (about 1 μm in width) polycrystalline silicon as a result of random nucleation. Mobilities in the range of, for example 20 to 80 $cm^2.V^{-1}.s^{-1}$ can be obtained.

However, instead of furnace annealing, it can be even more advantageous to anneal the deposited film material by irradiating its upper face with an energy beam, for example a laser beam. Depending on the detailed conditions polycrystalline silicon mobilities in the range of, for example, 10 to 175 $cm^2.V^{-1}.s^{-1}$ can be obtained in this manner. Furthermore, laser annealing permits selective local crystallization of the film so that, for example, polycrystalline silicon driver TFTs can be formed in peripheral areas of a LCD substrate, and a central area of the same substrate may comprise amorphous silicon devices of the LCD.

Visible light from an argon laser or infrared radiation from a $CO_2$ laser may be used for the annealing step. However, it is preferable to employ ultra-violet radiation from, for example, an excimer laser. An advantage of ultra-violet radiation is its smaller absorption depth so that, for example, the thickness of the film may be larger than the absorption depth of the ultra-violet radiation in the amorphous material. This smaller absorption depth reduces heating of the substrate and of the interface between the substrate and the semiconductor film. The applicants have found that such heating of the substrate can reduce the yield of the manufacturing process by weakening the adhesion of the semiconductor film to the substrate. Hence, it is advantageous in accordance with the invention to provide the insulated gate at the opposite (i.e. upper) face of the film and to do so after annealing the film to form a good quality crystal grain structure adjacent to its upper face. An insulating layer of the insulated-gate structure may be present on the semiconductor film during the annealing. However, it seems at present that a better crystal grain structure may be obtained for the TFT channel when the upper face of the film is not covered with such a layer during the annealing.

In addition to the advantages already described in providing the gate as a photomask at the upper face of the semiconductor film, a particular method in accordance with the present invention also permits the formation of a lower-doped part of the drain to reduce the field at the drain. Thus, for example, one particular method in accordance with the invention may be further characterised in that the conductive layer is of doped semiconductor material having a lower doping level in a lower part of the layer below an upper part of higher conductance, and in that, after removing the conductive layer from over the gate, the upper part is etched away from the lower part at an area at least at the drain side of the gate so as to space the higher-conductance upper part of the drain laterally from the channel by a lower-doped part of the conductive layer. The provision of this lower-doped part can serve to reduce a localised high electric field which occurs at the drain edge of the gate with high drain bias and which may otherwise lead to degradation of the TFT performance by trapping hot carriers injected into the insulated-gate structure. If desired, a similar low-doped source part may be formed at the source side of the gate. However, using a particular method in accordance with the invention, it is possible to expose the low-doped part only at the drain side and even to define the lateral extent of the low-doped drain part using a shadow-masking effect of the insulated gate.

Thus, for example, in one form in accordance with the invention a second photolithographic step using negative photoresist is used to define the area at which the upper part of the conductive layer is etched away from the lower part, the negative photoresist in the second photolithographic step being exposed by illumination through the substrate at such an angle that the insulated gate shadow-masks the photoresist over an area of the conductive layer at the drain side of the insulated gate. In another form in accordance with the invention a photolithographic step using a positive photoresist is used to define the area at which the upper part of the conductive layer is etched away from the lower part, the positive photoresist being exposed by illuminating its upper face which is remote from the substrate at such an angle that the insulated gate shadow-masks the photoresist over the area of the conductive layer at the drain side of the insulated gate; and in this case the shadow-masked area of the photoresist which remains after developing the exposed photoresist may be used in a lift-off process to form a complementary mask on the surrounding area for protecting the surrounding area while etching away said upper part of the conductive layer at the drain side of the insulated gate.

BRIEF DESCRIPTION OF THE DRAWINGS

These and other features in accordance with the invention are illustrated specifically in embodiments of the invention now to be described, by way of example, with reference to the accompanying diagrammatic drawings. In these drawings.

Figure 1:
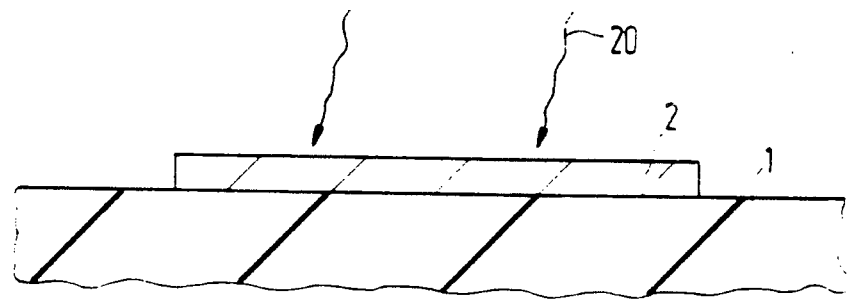
FIG. 1 is a cross-section of a semiconductor film deposited on a substrate at an early stage in the manufacture of a TFT by a method in accordance with the invention.

It should be noted that all the drawings are diagrammatic and not drawn to scale. Relative dimensions and proportions of parts of the Figures have been shown exaggerated or reduced in size for the sake of clarity and convenience in the drawings. The same reference signs are generally used to refer to corresponding or similar features in the different embodiments.

DESCRIPTION OF THE INVENTION

Figure 3:
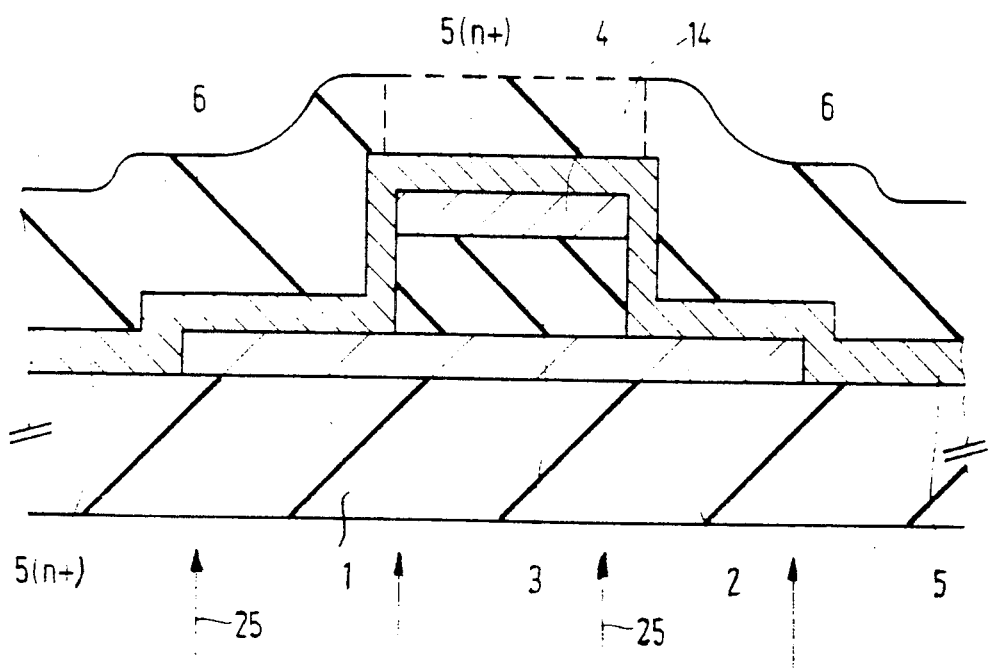
Figure 4:
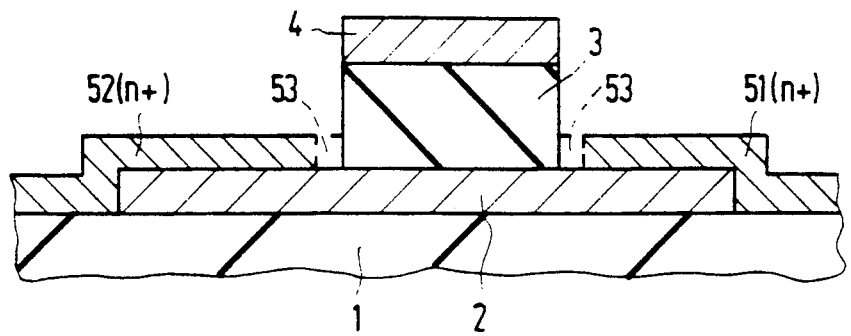
Figure 5:
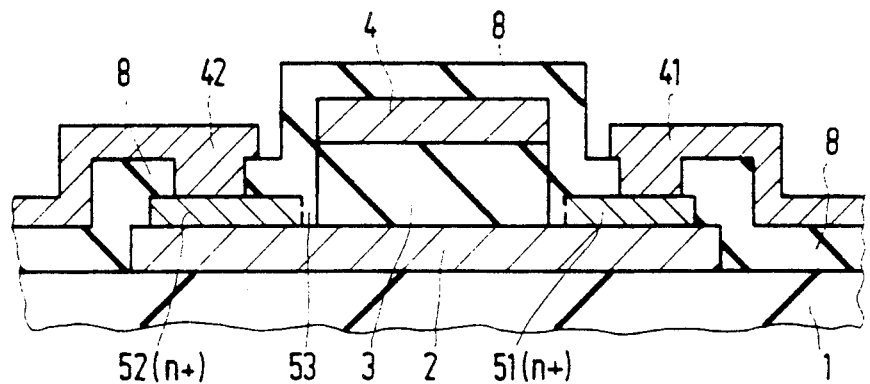

FIGS. 1 to 5 illustrate one example of a method in accordance with the invention for manufacturing an insulated-gate TFT. The TFT of FIG. 5 is present on a transparent substrate 1 and comprises a semiconductor film 2, for example of polycrystalline silicon. The film 2 provides a transistor channel adjacent to an insulated gate structure 3 and 4. The channel and the insulated gate are present between source and drain 51 and 52 of the TFT. These source and drain 51 and 52 are formed from a conductive layer 5 (FIG. 3) which in the form illustrated is, for example, highly doped n-type silicon (n+). These n+ source and drain 51 and 52 are contacted in the TFT structure of FIG. 5 by metal electrodes 41 and 42 respectively of, for example, aluminium or chromium.

In brief summary the manufacturing method illustrated in FIGS. 1 to 5 comprises the steps of:

(a) depositing material for the semiconductor film 2, on the substrate 1, see FIG. 1, (b) forming the insulated gate structure 3 and 4 at the upper face of the film 2, i.e. the face remote from the substrate 1, (c) depositing the conductive layer 5 on the insulated gate 3 and 4 and on the semiconductor film 2 beside the insulated gate, (d) coating the conductive layer 5 with a negative photoresist 6, and then exposing the photoresist by illumination 25 through the substrate 1 while using the gate 4 as a photomask, see FIG. 3, and (e) removing the conductive layer 5 from over the gate 4 so as to leave separate parts 51 and 52 on the semiconductor film 2 at opposite sides of the insulated gate 3,4, for forming the source and drain of the transistor.

A specific example of the method of FIGS. 1 to 5 will now be described. In this specific example, the substrate 1 may be an alkali-free alumino-borosilicate glass, and a LCD may, for example, be constructed on another area of the substrate 1 not shown in the cross-section of FIGS. 1 to 5. Using either a low-pressure chemical vapour deposition process at about 540° C. or a plasma-enhanced chemical vapour deposition process at about 250° C., hydrogenated amorphous silicon may be deposited on the glass substrate 1 from silane to form the film 2 with a thickness of, less than 0.1 $\mu$m, for example about 40 nm or 60 nm. A photolithographic step is then carried out to mask areas of the film 2 where the TFT and other devices are to be formed, and the unmasked areas are etched away to leave amorphous silicon islands 2 on the substrate 1.

FIG. 1 shows one such island 2 where a single polycrystalline silicon TFT is to be formed. It should be understood that the substrate 1 of FIG. 1 carries many other such silicon islands 2, some of which are to be processed in the same manner as that shown in FIGS. 1 to 5 and some of which may be processed differently to form a different type of TFT (e.g. an amorphous silicon TFT) or other device.

As illustrated by the arrows 20 in FIG. 1 those amorphous silicon islands 2 which are to be annealed to polycrystalline silicon are irradiated at their upper face remote from the substrate 1 with a laser beam 20. Preferably ultra-violet radiation 20 is used with an absorption depth in the silicon of less than the thickness of the silicon film 2. Thus, for example, an ultra-violet wavelength of 248 nm from an excimer laser may be used and has an absorption depth of about 6 nm in the amorphous silicon film 2. The film 2 may be exposed to multiple pulses (for example, several tens of pulses) from this laser with a pulse energy of between 100 mJ.cm$^{-2}$ and 300 mJ.cm$^{-2}$ per pulse. In this case it is found for a 40 nm or 60 nm thick film 2, crystallization into large grains of about 80 nm width occurs adjacent to its upper surface whereas the underlying material adjacent to the substrate 1 comprises only fine grains of up to about 25 nm in width and may even remain substantially amorphous at the interface with the substrate 1. The grain size at the upper surface may increase with increase in the number of pulses to which it is exposed at a given scan rate. More pulses are needed to effect the same anneal if a faster scan rate is used.

The large-grain layer adjacent the upper face of the film 2 provides a high mobility (e.g. in excess of 30 cm$^2$.V$^{-1}$.s$^{-1}$ for a 200 mJ.cm$^{-2}$ energy pulse) for the TFT channel. This is adequate for both row and column driver circuits of a LCD. Thus, for example, for row and column shift registers operating at about 30 kHz and 11 MHz respectively, the field-effect mobility for row driver TFTs should be in excess of about 1 cm$^2$.V$^{-1}$.s$^{-1}$, whereas that for column driver TFTs should be in excess of about 25 cm$^2$.V$^{-1}$.s$^{-1}$. The conductivity of the large-grain layer is effectively intrinsic with its Fermi level near the middle of the energy bandgap. However the film 2 may be lightly doped with a suitable donor such as phosphorus or a suitable acceptor such as boron so as to adjust the gate threshold voltage of the TFT and/or to give the crystallized film 2 a light n or p type conductivity.

The large grains in the upper portion are believed to result from surface melting of the silicon by the strongly absorbed ultra-violet, whereas the underlying fine grains appear to result from solid-phase recrystallization. The depth of the large-grain surface layer is found to be a strong function of incident laser energy, varying from about 10 nm for a 150 mJ.cm$^{-2}$ pulse to about 50 nm for a 250 mJ.cm$^{-2}$ pulse. Annealing the film 2 in this manner with an ultra-violet laser is advantageous in preserving good adhesion of the film 2 to the substrate 1. The applicants have also annealed such films 2 using visible radiation (514.5 nm) from an argon laser; in this case the film 2 is annealed to large crystal grains through most of its thickness, but there was a tendency for the film 2 to peel away from the substrate 1 due to the strong heating of the substrate.

Figure 2:
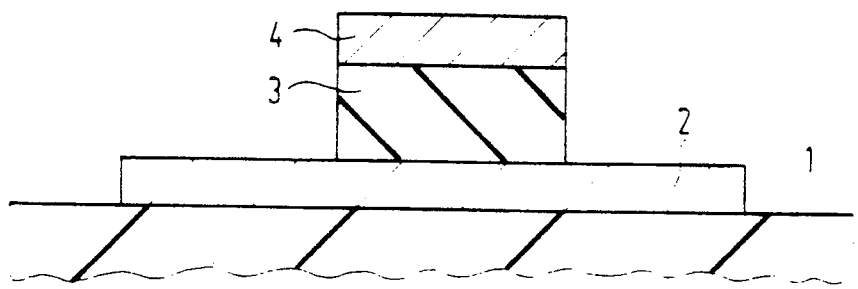
FIGS. 2 to 5 are similar cross-sections to that of FIG. 1 but at later stages in the manufacture of the TFT whose final structure is illustrated in FIG. 5.

After the film 2 is annealed in this manner, an insulating layer (for example of silicon dioxide) is deposited in known manner, followed by a conductive gate layer (for example of aluminium or chromium). A photolithographic and etching process is then carried out in known manner to remove these layers except in the areas where required to form the insulated gate structure 3 and 4 for the TFTs. The resulting structure is illustrated in FIG. 2. The remaining layer parts 3 and 4 extend as stripes (perpendicular to the plane of the drawing) across the film islands 2 which protrude laterally from beneath opposite ends of the insulated gate structure 3 and 4 as shown in FIG. 2.

The conductive layer 5 of for example phosphorus-doped silicon is then deposited in known manner by chemical vapor deposition and is coated with the negative photoresist 6. The n type layer 5 may be, for example, about 20 nm thick, and the photoresist 6 may be about 1 μm thick. The photolithographic and etching process for forming the source and drain 51 and 52 from the layer 5 is now carried out.

As illustrated in FIG. 3, the negative photoresist 6 is exposed by illumination with radiation 25 through the combination of the substrate 1, film 2, and layer 5 which together are transparent to the wavelength (for example in the near ultraviolet or visible region of the spectrum) chosen for the illumination 25. Although the insulating layer 3 may also be transparent, the metal gate 4 is opaque at this wavelength and so acts as a photomask. The photoresist is then developed in known manner, and so a window 14 is opened in the unexposed photoresist above the insulated gate 3 and 4 and uncovers the conductive layer 5 in this area. The window 14 is illustrated in broken outline in FIG. 3. The layer 5 is then etched away at the window 14 so as to expose the insulated-gate structure 3 and 4 and form the separate source and drain 51 and 52 from the remaining parts of the layer 5 covered by the remaining photoresist 6. The gate 4 is not etched to any significant extent in this etching treatment. FIG. 4 illustrates the resulting structure after removal of the remaining photoresist 6.

As illustrated by the broken lines at the edges of the source and drain 51 and 52 adjacent to the insulated-gate structure 3 and 4, the etch removal of the layer 5 at the window 14 may be continued until a small gap 53 appears between the edges of the gate structure and the facing edges of the source and drain 51 and 52. Alternatively the etching may be stopped when the source and drain layers 51 and 52 still abut the insulating layer 3, although care is then required to ensure that these layers 51 and 52 are etched back sufficiently as to avoid short-circuiting to the conductive gate 4. It is also possible for a silicon dioxide or other insulating layer to be deposited on the surface of the conductive gate 4 before the layer 5 so as to avoid any such short-circuit abutment of the source and drain 51 and 52 with the gate 4. Furthermore, such an insulating layer may assist in the etch removal of the layer 5 from over the gate 4 when the gate 4 or layer 5 are of materials which are different to those described above and for which selective etchant treatments are not so readily available.

The remaining source and drain parts interface with the large-grain high-mobility material at the upper face of the film 2 extending laterally beyond the insulated-gate structure 3 and 4. This arrangement provides a good and reliable electrical connection between the TFT channel and the source and drain 51 and 52. The sheet resistance of the source and drain layers 51 and 52 may be reduced if desired by a laser anneal. Because the source and drain 51 and 52 are formed using the gate 4 as a photomask, the gate-to-source and gate-to-drain capacitances are very low, for example less than about $2 \times 10^{-16}$F per μm of channel width, so permitting fast operation of this high-mobility polycrystalline silicon TFT in, for example, column driver circuits of LCDs.

The further extent of the source and drain layers 51 and 52 are then defined in a further photolithographic and etching step. An insulating overlay 8 is subsequently deposited, and metal connections 41,42,44 respectively to the source, drain and gate 51,52 and 4 are provided. Gate connection 44 is outside the plane of the drawings and so is not illustrated in any of the Figures.

With high drain bias (for example with drain voltages of above 15 volts) a localised high electric field region can be formed in the channel edge adjacent the drain 52. Charge carriers in this high field can attain kinetic energies in excess of a few eV and so may be injected over the interfacial potential barrier between the film 2 and the gate oxide 3. This carrier injection can cause degradation of the TFT characteristics, such as a reduction in transconductance or a shift in threshold voltage. As already described with reference to FIGS. 3 and 4, the conductive layer 5 at the window 14 can be etched back to such an extent that a small gap 53 is present between the facing edges of the drain 52 and the insulated-gate structure 3 and 4. This gap can assist in reducing the high field in this area and so reducing hot-carrier injection.

Figure 6:
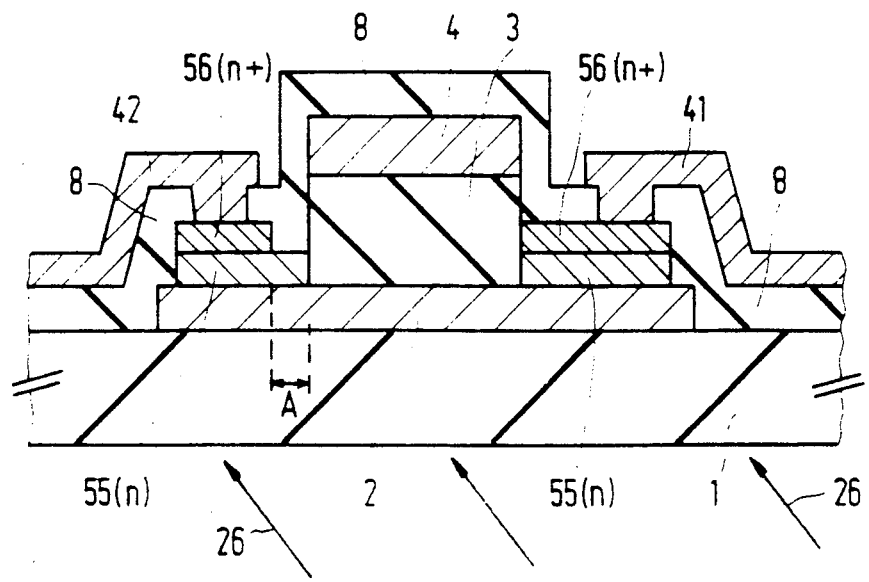
FIG. 6 is a cross-section similar to that of FIG. 5 but illustrating a modified TFT structure having a low-doped drain part extending laterally between the insulated gate and the main drain electrode part.

However, an even more advantageous structure can be obtained using a modified process which is also in accordance with the present invention. In this modified process the doping of the conductive layer 5 changes through the thickness of the layer 5 so as to be less in a lower part 55 than it is in a highly conductive upper part 56. The doping level may be varied progressively during the deposition of the layer 5, or the layer 5 may be deposited as two superimposed layers 55 and 56 of different doping levels. After removing the layers or layer parts 55 and 56 from over the gate 4, the upper part 56 is in this case etched away from the lower part 55 at an area A at least at the drain side of the gate 4 so as to space the higher-conductance upper part 56 of the drain 52 laterally from the channel by a lower-doped part 55 of the layer 5. The resulting structure is illustrated in FIG. 6.

The area A over which the upper part 56 is etched away may be defined using a separate photomask and requiring an extra alignment step. However, it is also possible to use the insulated-gate structure 3,4 as the photomask, by illuminating the photoresist at such an angle that the insulated-gate structure 3,4 shadow-masks an area of the photoresist at the drain side of the gate 4. This is illustrated by the arrows 26 in FIG. 6. The angled illumination 26 may be used instead of the perpendicular illumination 25 of FIG. 3 so that the window 14 formed in the negative photoresist 6 is shifted laterally towards the drain. The etching away of the upper part 56 from the lower part 55 may then be effected through this window 14 by continuation of the etching step(s) to remove the layer(s) 55 and 56 from over the gate 4. However this variation in the photolithographic and etching process steps of FIGS. 3 and 4 can be difficult to reproduce reliably in a manufacturing process, and so preferably the angled illumination 26 is carried out in a separate photolithographic step after the steps of FIGS. 3 and 4.

Figure 7:
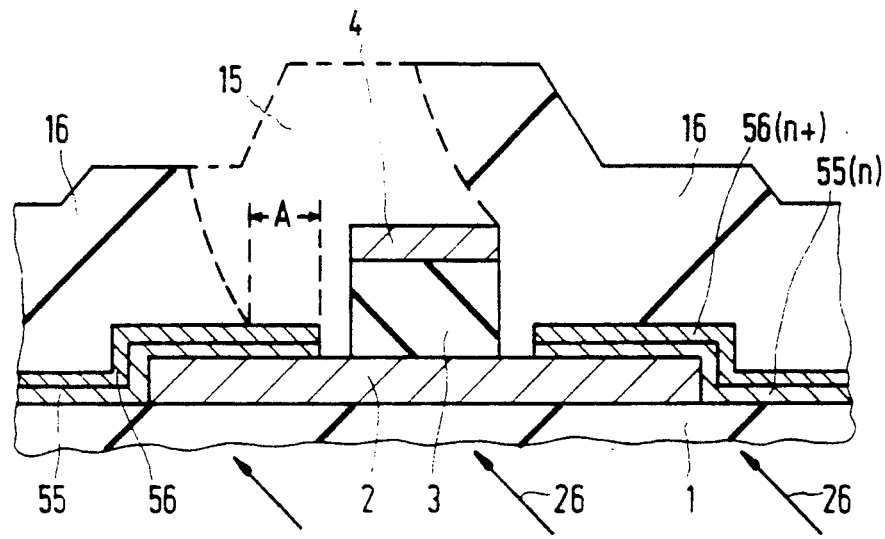
FIG. 7 is a similar cross-section of the TFT structure of FIG. 6 but at a stage in one method for its manufacture in accordance with the invention and involving a second photolithographic step using the insulated gate to shadow-mask a negative photoresist.

FIG. 7 illustrates such a separate step in which a new negative photomask 16 is coated on the FIG. 4 structure, the conductive layer 5 of which has the different doping levels of 55 and 56. The exposed photoresist 16 is then slightly overdeveloped so as to form a widened window 15 at the unexposed area which was shadow-masked by the gate 4. FIG. 7 illustrates the resulting structure before carrying out the etching step to remove the exposed higher-doped upper part 56 from the lower part 55 at the drain side of the insulated-gate structure 3 and 4. If desired a selective etchant may be used which attacks the higher doped material more rapidly than the lower doped material.

Figure 8:
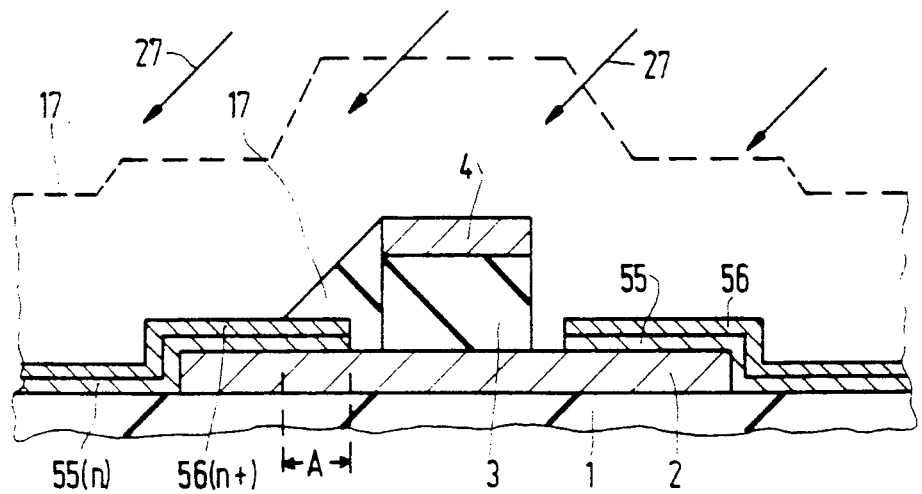
FIGS. 8 and 9 are similar cross-sections of the TFT structure of FIG. 6 but at two successive stages in another method for its manufacture in accordance with the invention and involving a photolithographic step using the insulated gate to shadow-mask a positive photoresist.
Figure 9:
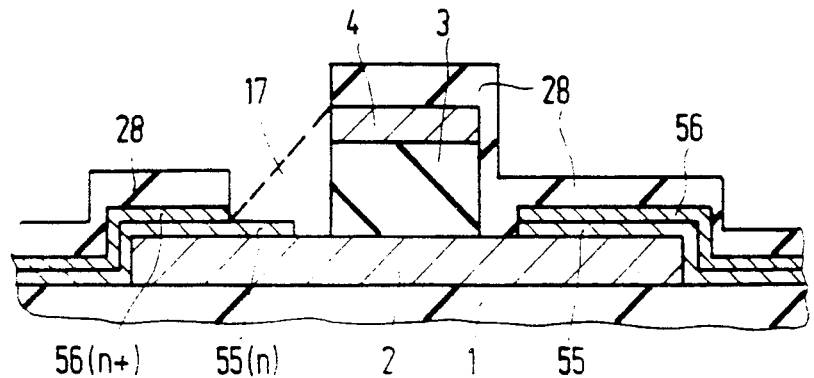

Instead of using a second photolithographic step with a negative photoresist 16, a step with a positive photoresist 17 may be used as illustrated in FIG. 8. In this case, the positive photoresist is exposed by illuminating its upper face at a suitable angle (arrows 27) for the insulated gate 4 to shadow-mask the resist 17 over an area at the drain side. The original coating of positive resist 17 is shown in broken outline in FIG. 8, which also shows in solid outline the shadow-masked area of the resist 17 which remains after developing the exposed photoresist. This remaining resist area 17 is then used in a lift-off process to form a complementary mask 28 on the surrounding area. The mask 28 is formed by depositing a layer of gold for example and then dissolving the remaining resist area 17 to float off the overlying part of gold layer. The mask 28 is then used to protect the underlying surrounding area while etching away the upper part 56 from the lower part 55 at the drain side of the insulated gate 3 and 4. FIG. 9 shows the resulting structure before removal of the mask 28.

The manufacture of n channel TFTs has been illustrated with reference to the drawings. However, the invention may also be used in the manufacture of p channel devices, having p type source and drain 51 and 52. The source and drain layers 51 and 52 may even be metallic, for example of indium-tin-oxide, in which case the deposition of an insulating layer on the gate 4 before depositing the metallic layer 5 can be desirable to facilitate the etch-removal of the layer 5 from over the gate 4.

From reading the present disclosure, other variations and modifications will be apparent to persons skilled in the art. Such variations and modifications may involve equivalents and other features which are already known in the design, manufacture and use of TFTs and other semiconductor devices and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A method of manufacturing an insulated-gate thin-film transistor comprising a semiconductor film which provides a transistor channel adjacent to an insulated gate between source and drain of the transistor, the source and drain being formed from a conductive layer which is removed from over the gate using a photolithographic step, in which step the gate serves as a photomask while exposing a negative photoresist on the conductive layer by illumination through a transparent substrate, which method is characterized by the steps of:
   (a) depositing material for the semiconductor film, on the substrate,
   (b) forming the insulated gate at the upper face of the semiconductor film, which face is remote from the substrate,
   (c) depositing the conductive layer on the insulated gate and on the semiconductor film beside the insulated gate,
   (d) coating the conductive layer with the negative photoresist, and effecting the photolithographic step by exposing the photoresist through the combination of the substrate, semiconductor film and conductive layer which together are transparent to the illumination, and
   (e) removing the conductive layer from over the gate so as to leave separate parts of the conductive layer on the semiconductor film at opposite sides of the insulated gate, for forming the source and drain of the transistor.

2. A method as claimed in claim 1, further characterized in that the film material is deposited in a fine-grain or amorphous form in step (a), and in that this deposited material is annealed on the substrate before step (b) so as to crystallize the film at least adjacent to its upper face which is remote from the substrate.

3. A method as claimed in claim 2, further characterized in that the deposited material is annealed in a furnace by heating on the substrate.

4. A method as claimed in claim 2, further characterized in that the deposited material is annealed by irradiating its upper face with an energy beam.

5. A method as claimed in claim 4, further characterized in that the annealing is carried out with ultra-violet radiation from a laser.

6. A method as claimed in claim 5, further characterized in that the thickness of the film deposited on the substrate is larger than the absorption depth of the ultra-violet radiation in the semiconductor material.

7. A method as claimed in claim 2, further characterized in that the step (b) includes providing an insulating layer at the crystallized upper face of the film and depositing a gate layer on the insulating layer.

8. A method as claimed in claim 1, further characterized in that the conductive layer is of doped semiconductor material having a lower doping level in a lower part of the layer below an upper part of higher conductance, and in that, after removing the conductive layer from over the gate, the upper part is etched away from the lower part at an area at least at the drain side of the gate so as to space the higher conductance upper part of the drain laterally from the channel by a lower-doped part of the conductive layer.

9. A method as claimed in claim 8, further characterized in that a second photolithographic step using a second negative photoresist is used to define the area at which the upper part of the conductive layer is etched away from the lower part, the second negative photoresist in the second photolithographic step being exposed by illumination through the substrate at such an angle that the insulated gate shadow-masks the photoresist over an area of the conductive layer at the drain side of the insulated gate.

10. A method as claimed in claim 8, further characterized in that a second photolithographic step using a positive photoresist is used to define the area at which the upper part of the conductive layer is etched away from the lower part, the positive photoresist being exposed by illuminating its upper face which is remote from the substrate at such an angle that the insulated gate shadow-masks the positive photoresist over the area of the conductive layer at the drain side of the insulated gate, and in that the shadow-masked area of the positive photoresist remains after developing the exposed positive photoresist and is used in a lift-off process to form a complementary mask on the surrounding area for protecting the surrounding area while etching away said upper part of the conductive layer at the drain side of the insulated gate.

* * * * *